US008741725B2

(12) United States Patent
Johnson et al.

(10) Patent No.: US 8,741,725 B2
(45) Date of Patent: Jun. 3, 2014

(54) BUTTED SOI JUNCTION ISOLATION STRUCTURES AND DEVICES AND METHOD OF FABRICATION

(75) Inventors: Jeffrey B. Johnson, Essex Junction, VT (US); Shreesh Narasimha, Beacon, NY (US); Hasan M. Nayfeh, Poughkeepsie, NY (US); Viorel Ontalus, Danbury, CT (US); Robert R. Robison, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 624 days.

(21) Appl. No.: 12/943,084

(22) Filed: Nov. 10, 2010

(65) Prior Publication Data
US 2012/0112280 A1 May 10, 2012

(51) Int. Cl.
*H01L 29/06* (2006.01)

(52) U.S. Cl.
USPC .......................................................... 438/347

(58) Field of Classification Search
CPC ................................................ H01L 21/76237
USPC .......... 257/347, 400, 509, 349, 336, E27.112,
257/E29.02, E29.266, E21.437, 254;
438/163, 222, 149, 282, 298, 479, 517,
438/910, 300
See application file for complete search history.

(56) References Cited

U.S. PATENT DOCUMENTS

| 5,057,443 | A | * | 10/1991 | Hutter ........................... 438/330 |
| 7,544,997 | B2 | | 6/2009 | Zhang et al. |
| 7,960,229 | B2 | * | 6/2011 | Yang et al. ..................... 438/259 |
| 2008/0299724 | A1 | * | 12/2008 | Grudowski et al. ........... 438/257 |
| 2009/0026552 | A1 | | 1/2009 | Zhang et al. |
| 2009/0278201 | A1 | * | 11/2009 | Chatty et al. ................... 257/347 |
| 2010/0224938 | A1 | | 9/2010 | Zhu |

FOREIGN PATENT DOCUMENTS

KR          20090118935          11/2009

OTHER PUBLICATIONS

Hine et al. ("A new isolation technology for bipolar devices by low pressure selective silicon epitaxy" IEEE Xplore VLSI Technology, 1982.Digest pp. 116-117).*
Lo et al., PD-SOI MOSEFET Body-to-Body Leakage Scaling Trend and Optimization, 2008 IEEE International SOI Conference Proceedings, pp. 49-50.
PCT Written Opinion of the International Searching Authority (Mail Date May 24, 2012); International Application No. PCT/US2011/060084; Filing date Nov. 10, 2011; 9 pages.

* cited by examiner

*Primary Examiner* — Howard Weiss
*Assistant Examiner* — Sue Tang
(74) *Attorney, Agent, or Firm* — Schmeiser, Olsen & Watts; Richard Kotulak

(57) ABSTRACT

A structure, a FET, a method of making the structure and of making the FET. The structure including: a silicon layer on a buried oxide (BOX) layer of a silicon-on-insulator substrate; a trench in the silicon layer extending from a top surface of the silicon layer into the silicon layer, the trench not extending to the BOX layer, a doped region in the silicon layer between and abutting the BOX layer and a bottom of the trench, the first doped region doped to a first dopant concentration; a first epitaxial layer, doped to a second dopant concentration, in a bottom of the trench; a second epitaxial layer, doped to a third dopant concentration, on the first epitaxial layer in the trench; and wherein the third dopant concentration is greater than the first and second dopant concentrations and the first dopant concentration is greater than the second dopant concentration.

22 Claims, 8 Drawing Sheets

BUTTED SOI JUNCTION ISOLATION STRUCTURES AND DEVICES AND METHOD OF FABRICATION

FIELD OF THE INVENTION

The present invention relates to the field of integrated circuit devices; more specifically, it relates to a butted silicon-on-insulator (SOI) junction isolation structure and butted SOI junction isolation field effect transistors (FETs) and the methods of fabricating butted SOI junction isolation structures and butted SOI junction isolation FETs.

BACKGROUND

Integrated circuits fabricated in SOI technology rely on adjacent FETs being electrically isolated from each other. However, when coupled with the need for decreasing the size of the FETs the very nature of the isolation can create undesired effects in the FETs such as FET to FET leakage and short channel effects. Accordingly, there exists a need in the art to eliminate the deficiencies and limitations described hereinabove.

SUMMARY

A first aspect of the present invention is a structure, comprising: a silicon layer on a buried oxide layer of a silicon-on-insulator substrate; a trench in the silicon layer extending from a top surface of the silicon layer into the silicon layer, the trench not extending to the buried oxide layer; a doped region in the silicon layer between and abutting the buried oxide layer and a bottom of the trench, the first doped region doped to a first dopant concentration; a first epitaxial layer, doped to a second dopant concentration, in a bottom of the trench; a second epitaxial layer, doped to a third dopant concentration, on the first epitaxial layer in the trench; and wherein the third dopant concentration is greater than the first and second dopant concentrations and the first dopant concentration is greater than the second dopant concentration.

A second aspect of the present invention is, where the doped region, the first epitaxial layer and the second epitaxial layer of the invention described in the first aspect are all doped by a same dopant type.

A third aspect of the present invention, where the doped region and the first epitaxial layer of the invention described in the first aspect are doped by a first dopant type and the second epitaxial layer is doped by a second and opposite dopant type.

A fourth aspect of the present invention, where the doped region and the first epitaxial layer of the invention described in the first aspect are doped by a first dopant type and the second epitaxial layer is net doped zero or is intrinsic.

A fifth aspect of the present invention is the invention described in the first aspect, further including: an additional doped region, doped to a fourth dopant concentration, in an upper region of the second epitaxial layer and abutting a top surface of the second epitaxial layer, the fourth dopant concentration greater than the third dopant concentration.

A sixth aspect of the present invention is the invention described in the fifth aspect, wherein: (i) the doped region, the additional doped region, the first epitaxial layer and the second epitaxial layer are all doped a same dopant type; or (ii) the doped region, the additional doped region and the first epitaxial layer are doped a first dopant type and the second epitaxial layer is doped a second and opposite dopant type; or (iii) the doped region, the additional doped region and the first epitaxial layer are doped a first dopant type and the second epitaxial layer is net doped zero or is intrinsic.

An seventh aspect of the present invention is a field effect transistor, comprising: a silicon layer on a buried oxide layer of a silicon-on-insulator (SOI) substrate; first and second butted SOI junction isolation on opposite side of a channel region in the silicon layer, each butted SOI junction isolation comprising: a trench in the silicon layer extending from a top surface of the silicon layer into the silicon layer, the trench not extending to the buried oxide layer; a doped region in the silicon layer between and abutting the buried oxide layer and a bottom of the trench, the first doped region doped to a first dopant concentration; a first epitaxial layer, doped to a second dopant concentration, in a bottom of the trench; a second epitaxial layer, doped to a third dopant concentration, on the first epitaxial layer in the trench; and wherein the third dopant concentration is greater than the first and second dopant concentrations and the first dopant concentration is greater than the second dopant concentration; and a gate dielectric layer on a top surface of the silicon layer between the first and second butted SOI junction isolation; a gate electrode on the gate dielectric; wherein the doped region and the second epitaxial layers of the first and second butted SOI junction isolations are all doped a same dopant type and a body region of the silicon layer between the first and second butted junction SOI isolation is doped a second and opposite dopant type.

An eighth aspect of the present invention is a method, comprising: providing a silicon layer on a buried oxide layer of a silicon-on-insulator substrate; etching a trench in the silicon layer extending from a top surface of the silicon layer into the silicon layer, the trench not extending to the buried oxide layer; ion implanting a dopant species into the silicon layer under the bottom of the trench to form a doped region in the silicon layer, the first doped region doped to a first concentration; performing a first epitaxial deposition to form a first epitaxial layer doped to a second concentration in a bottom of the trench; performing a second epitaxial deposition a second epitaxial layer doped to a third concentration on the first epitaxial layer in the trench; and wherein the third concentration is greater than the first and second concentrations and the first concentration is greater than the second concentration.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

Figure 1:
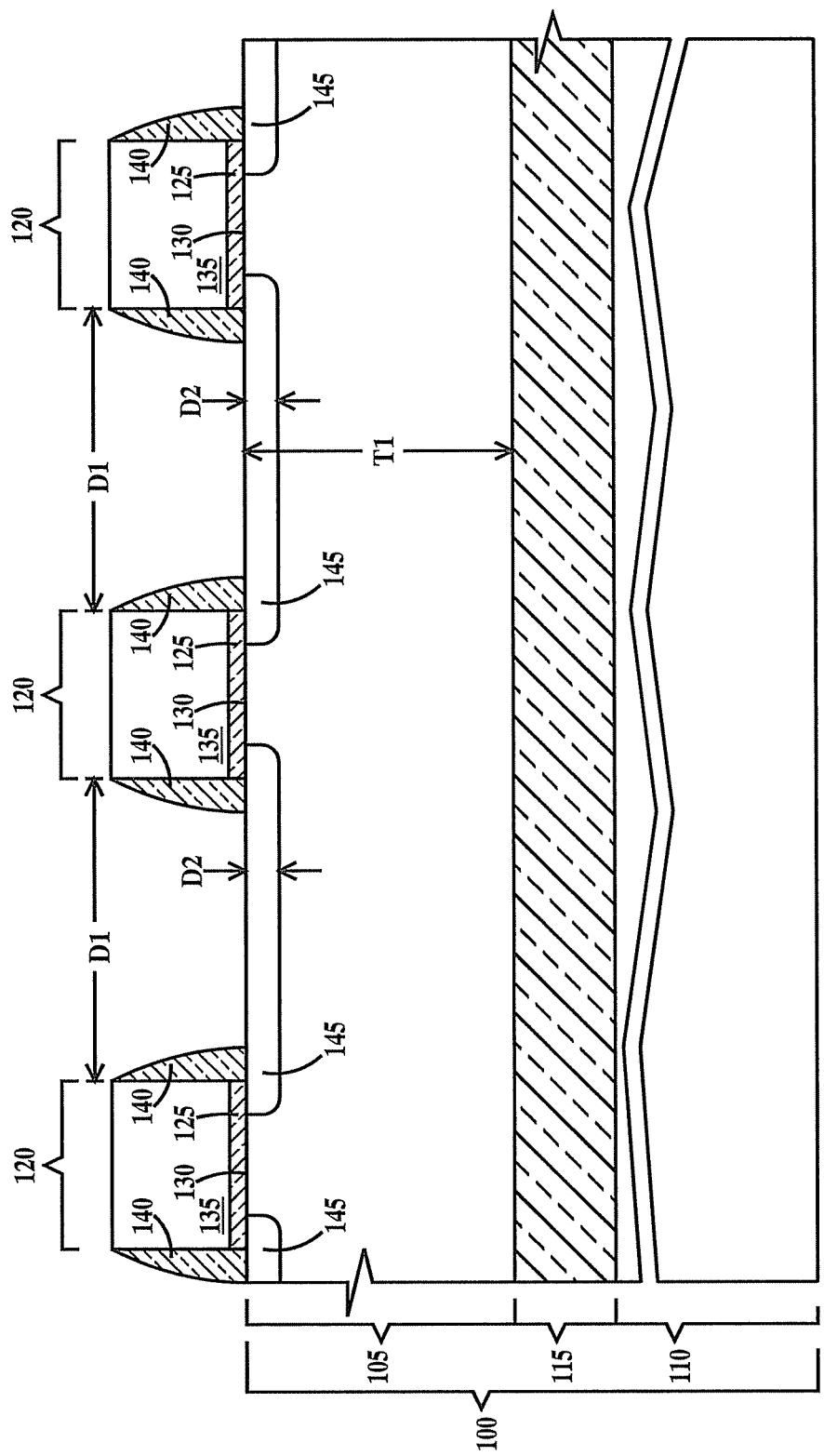
FIGS. 1-6 are cross-sectional drawing showing fabrication steps for adjacent FETs according to an embodiment of the present invention.

The term "doping concentration" is defined to be net doping concentration and net doping concentration is defined as $|N_A - N_D|$ where $N_A$ is the concentration of acceptor atoms and $N_D$ is the concentration of donor atoms. Acceptor atoms dope silicon (Si) P-type. Boron (B) is an example of a P-type dopant. Donor atoms dope silicon N-type. Phosphorus (P) and arsenic (As) are examples of N-type dopants. The term "intrinsic" in relation to silicon is defined as silicon with no (P or N) type dopant species, i.e., $N_A=0$ and $N_D=0$. Thus an intrinsic silicon layer should be distinguished from a silicon layer having a net doping of zero, i.e., $|N_A-N_D|=0$ where $N_A \neq 0$ and $N_D \neq 0$. The term "net doping type" is defined to be the dopant type of the higher concentration dopant species. When $N_A > N_D$ the silicon is net doped P type where $N_A < 0$, $N_D \neq 0$ or $N_D = 0$. When $N_D > N_A$ the silicon is net doped N type where $N_D < 0$, $N_A \neq 0$ or $N_A = 0$. The term "epitaxial silicon" excludes other group IV elements in the epitaxial layer. The term "epitaxial silicon germanium" allows germanium (Ge) atoms in the epitaxial layer. The term "epitaxial silicon carbide" allows carbon (C) atoms in the epitaxial layer. An epitaxial layer is a layer formed on a base single-crystal layer that continues the crystal lattice of the base layer into epitaxial layer.

An SOI substrate comprises an amorphous buried oxide (BOX), e.g., silicon oxide ($SiO_2$) layer between an upper single-crystal silicon layer and a supporting silicon substrate which may also be single-crystal silicon. When a n-channel FET (NFET) is fabricated adjacent to a p-channel FET (PFET), in SOI technology, the adjacent devices (e.g., NFET, PFET) are electrically isolated from each other by trench isolation (trenches filled with a dielectric material such as silicon oxide that extend from the top surface of the upper silicon layer in which the devices are fabricated to the BOX layer of the SOI substrate. The trench isolation prevents body-to-body leakage between the adjacent devices.

When a PFET is fabricated adjacent to another PFET (or an NFET is fabricated adjacent to another NFET) the adjacent devices may be electrically isolated from each other by their source/drains (S/Ds) which extend from the top surface of the upper silicon layer in which the devices are fabricated to the buried oxide layer of the SOI substrate. The source/drains themselves must abut the buried oxide layer (this is called a hard butted SOI junction isolation), or the depletion region of the source/drain must abut the buried oxide layer (this is called a soft butted SOI junction isolation) to prevent body-to-body leakage between the adjacent devices. Thus, not only do the adjacent devices share a common source/drain, but the common source/drain is relied upon for device isolation. This allows a significant decrease in the silicon area required for each device, thereby increasing device density and device performance, i.e., speed.

However, when butted SOI junction isolation is used in devices where the FET channel length is of the same order of magnitude as the depletion-layer widths of the source and drain junctions, short-channel effects become a significant problem. The channel length is the distance between the source and the drain under the gate of an FET measured parallel to the top surface of the upper silicon layer. The depletion widths are measured under the gate in the same direction as the channel length. Short-channel effects include drain-induced barrier lowering and punchthrough, surface scattering, velocity saturation, impact ionization and hot electron effects which may be attributed to the short electron drift region of the channel and the lowering of the threshold voltage ($V_t$) due to the shortened channel length.

The short channel effect in butted SOI junction isolation devices is due to lateral (defined infra) scattering of the deep ion implantations normally used to reach the vicinity of the buried oxide layer. The deeper an ion implantation is, the higher the probability of lateral scattering is.

In FIG. 1, an SOI substrate 100 includes a silicon layer 105 separated from a supporting substrate 110 by a buried dielectric layer 115. In one example, silicon layer 105 is single-crystal silicon. For a PFET, silicon layer 105 is an undoped or lightly doped N type. For an NPFET, silicon layer 105 is undoped or lightly doped P-type. In one example, the dopant concentration of silicon layer 105 is about 1E17 atm/cm³ to about 1E19 atm/cm³. In one example silicon layer 105 is intrinsic. In one example, substrate 110 is single-crystal silicon. In one example, buried dielectric layer 115 is $SiO_2$ (BOX). Silicon layer 105 has a thickness T1. In one example, T1 is about 40 nm to about 100 nm. A horizontal direction (including length and width) is defined as a direction parallel to top surface 130. A vertical direction (including depth) is defined as a direction perpendicular to the horizontal direction. A lateral direction is defined as a direction having a vector direction with both horizontal and vertical components.

Three gates 120 are illustrated in FIG. 1. Each gate 120 includes a gate dielectric layer 125 formed on a top surface 130 of silicon layer 105 and a gate electrode 135 formed on gate dielectric layer 125. Optional dielectric sidewall spacers 140 are formed on opposite sidewall of gate electrodes 135. In one example gate electrode 135 comprises a doped or undoped polysilicon, a metal, or combinations of layers thereof. In one example, gate dielectric layer 130 comprises $SiO_2$, silicon nitride ($Si_3N_4$) or combinations thereof. In one example gate dielectric layer 130 comprises a high K (dielectric constant) material examples of which include but are not limited to metal oxides such as $Ta_2O_5$, $BaTiO_3$, $HfO_2$, $ZrO_2$, $Al_2O_3$, metal silicates such as $HfSi_xO_y$ or $HfSi_xO_yN_z$ and combinations of layers thereof. A high K dielectric material has a relative permittivity above about 10. In one example, gate dielectric layer 130 is about 0.5 nm to about 1.5 nm thick. Gate electrodes 135 are spaced apart a distance D1. In one example, D1 is about 80 nm to about 260 nm. Spacers 140 may be fabricated by deposition of a blanket conformal layer followed by a reactive ion etch (RIE) to remove the conformal layer from horizontal surfaces while the conformal layer on vertical surfaces is not removed or partially removed.

Also shown in FIG. 1, are optional source/drain extensions 145. S/D extensions are formed by an angled (at an angle of less than 90° relative to top surface 130) ion implantation of a dopant species prior to spacer formation. For a PFET, the dopant species is P-type. For an NFET, the dopant species is N-type. In one example, the dopant concentration of source/drain extensions is about 1E20 atm/cm³ to about 3E20 atm/cm³. Source/drain extensions 145 extend into silicon layer a distance D2. In one example D2 is about 10 nm to about 20 nm.

Figures 2, 2A:
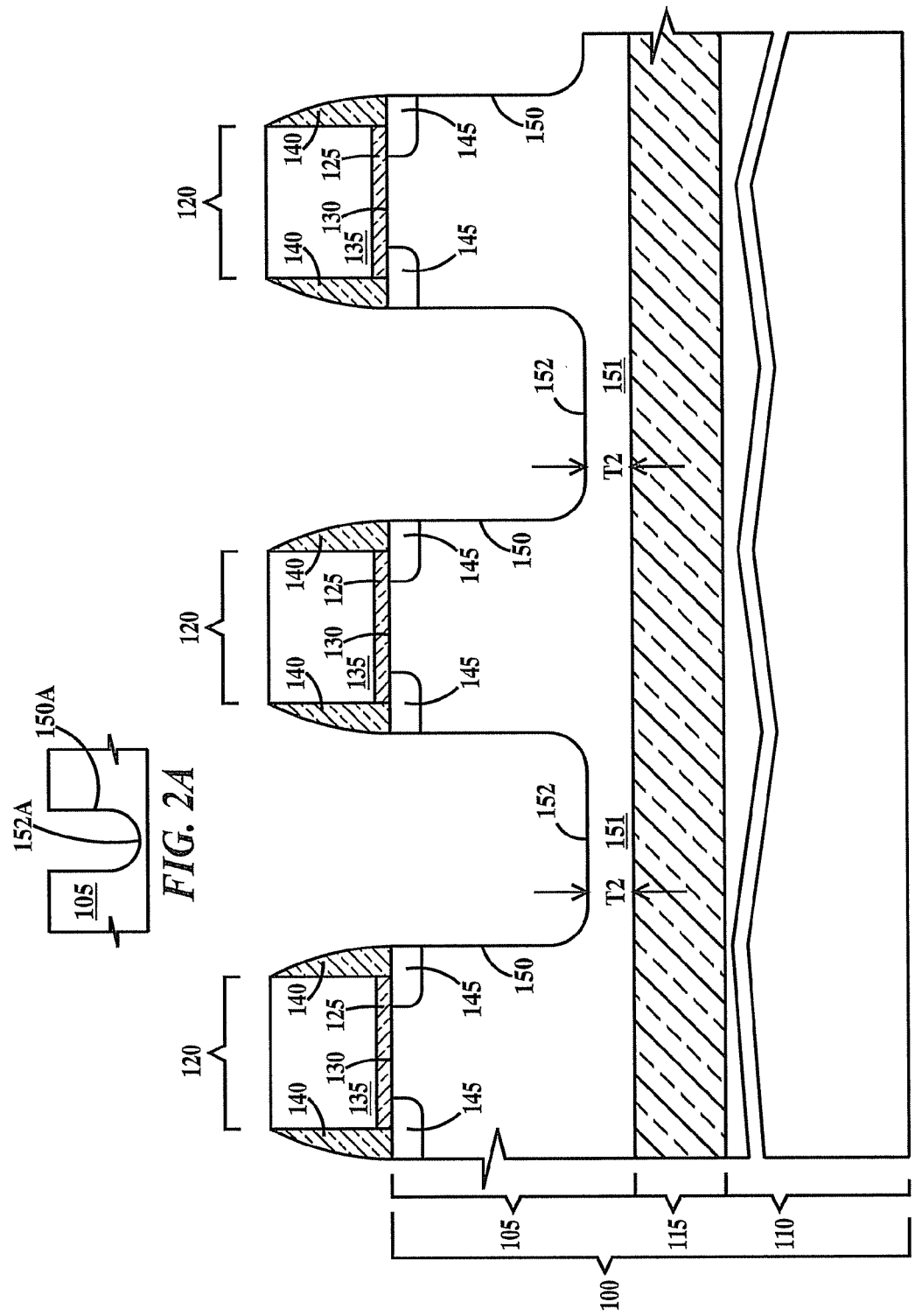

In FIG. 2, trenches 150 are etched into silicon layer 105 by, for example, a RIE selective to etch silicon relative to gate electrode 120 and spacers 140. Alternatively, gate electrode 120 and/or spacers 140 may be protected by a protective layer during the RIE. In the example of FIG. 2, trenches 150 do not extend to buried dielectric layer 115 but a region 151 of silicon layer 105 intervenes between bottoms 152 and a top surface 153 of buried dielectric layer 115. Preferably trenches 150 are do not to extend to buried dielectric layer 150. This is to prevent subsequent doping processes from doping and/or damaging the buried dielectric layer 115, thus making the buried dielectric layer electrically leaky by providing a current path between adjacent bodies or even punching through the buried dielectric layer to create a current leakage path to substrate 110. Regions 151 have a thickness T2. In one example T2 is about 10 nm to about 20 nm.

While in FIG. 2, trench bottoms 152 are flat, they may be rounded as in FIG. 2A, where trench 150A has a round bottom 152A.

Figure 3A:
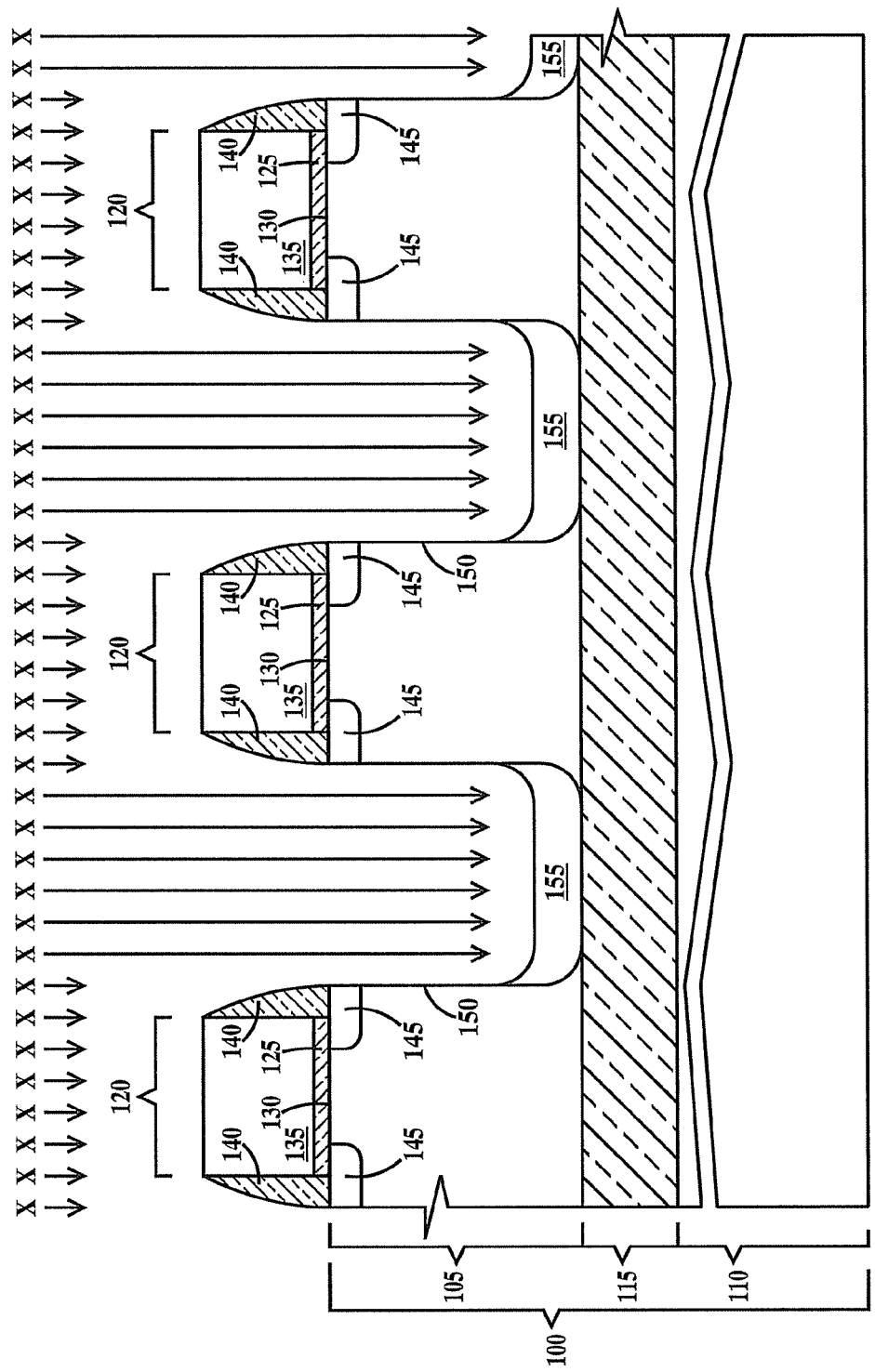
Figure 3B:
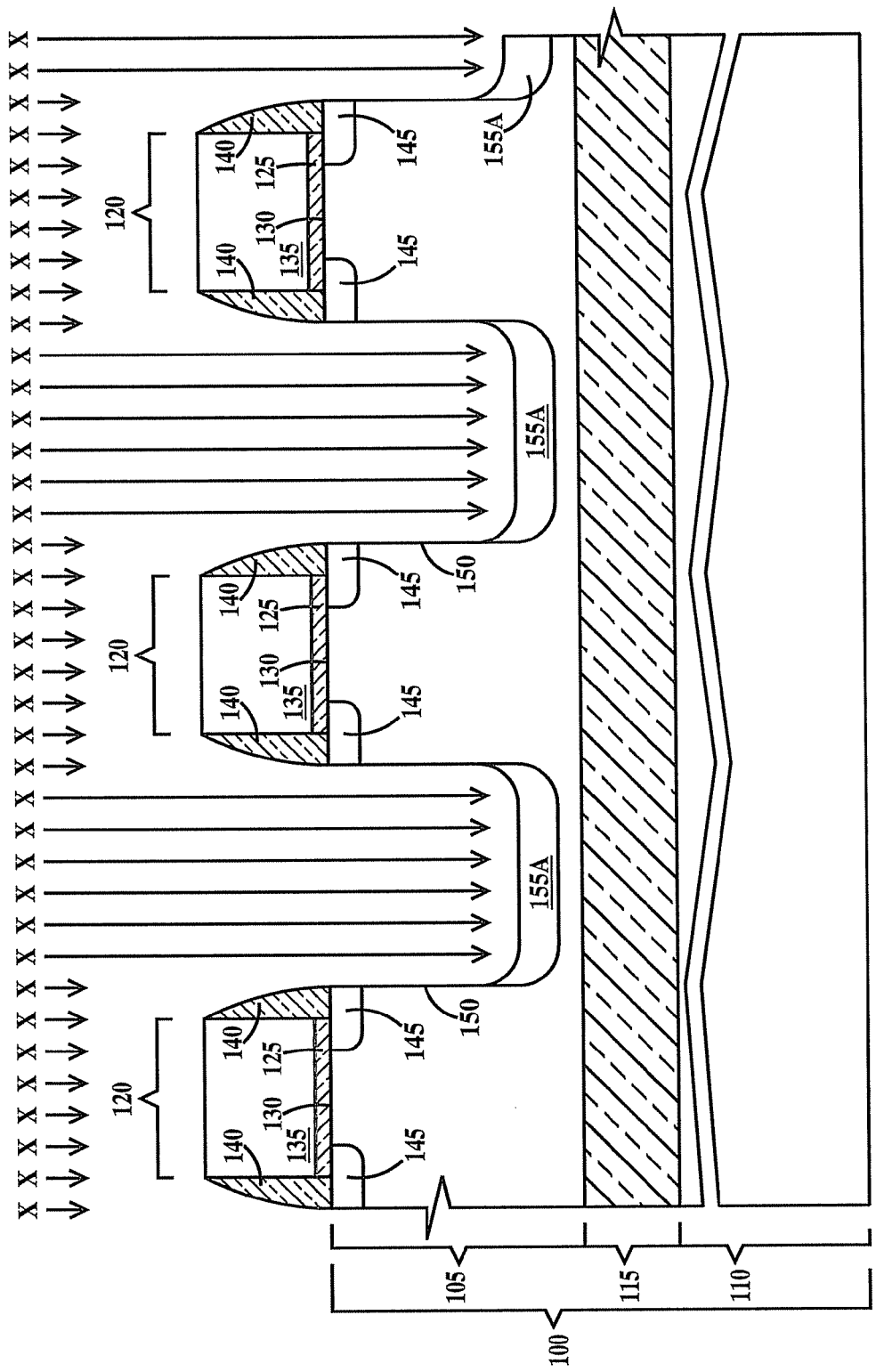

In FIG. 3A, an ion implantation of dopant species "X" is performed to form a doped region 155 abutting buried dielectric layer 115. For a PFET, dopant species X is P-type, for an NFET, dopant species X is N-type. Alternatively, as shown in FIG. 3B, the ion implantation does not abut buried dielectric layer 115. A thermal annealing step or heating caused by a subsequent process above about 700° C. extends ion implanted doped region 155A to abut buried dielectric layer 115 by thermal diffusion of the dopant species. Again, the reason for not extending the ion implantation to abut buried oxide layer 115 is to avoid making buried oxide layer 115 electrically leaky as explained supra. A thermal annealing may be performed immediately after the X-species ion implantation or at a subsequent step. Also, no separate thermal annealing for the purpose of extending doped region 155A may be required due to the temperatures and times of subsequent processes, such as epitaxial deposition described infra.

For a PFET doped region 155 (or 155A of FIG. 3B) is doped P-type and for an NFET doped region 155 (or 155A of FIG. 3B) is doped N-type. In one example, the dopant concentration of doped region 155 is about 1E18 atm/cm$^3$ to about 5E19 atm/cm$^3$.

Figure 4:
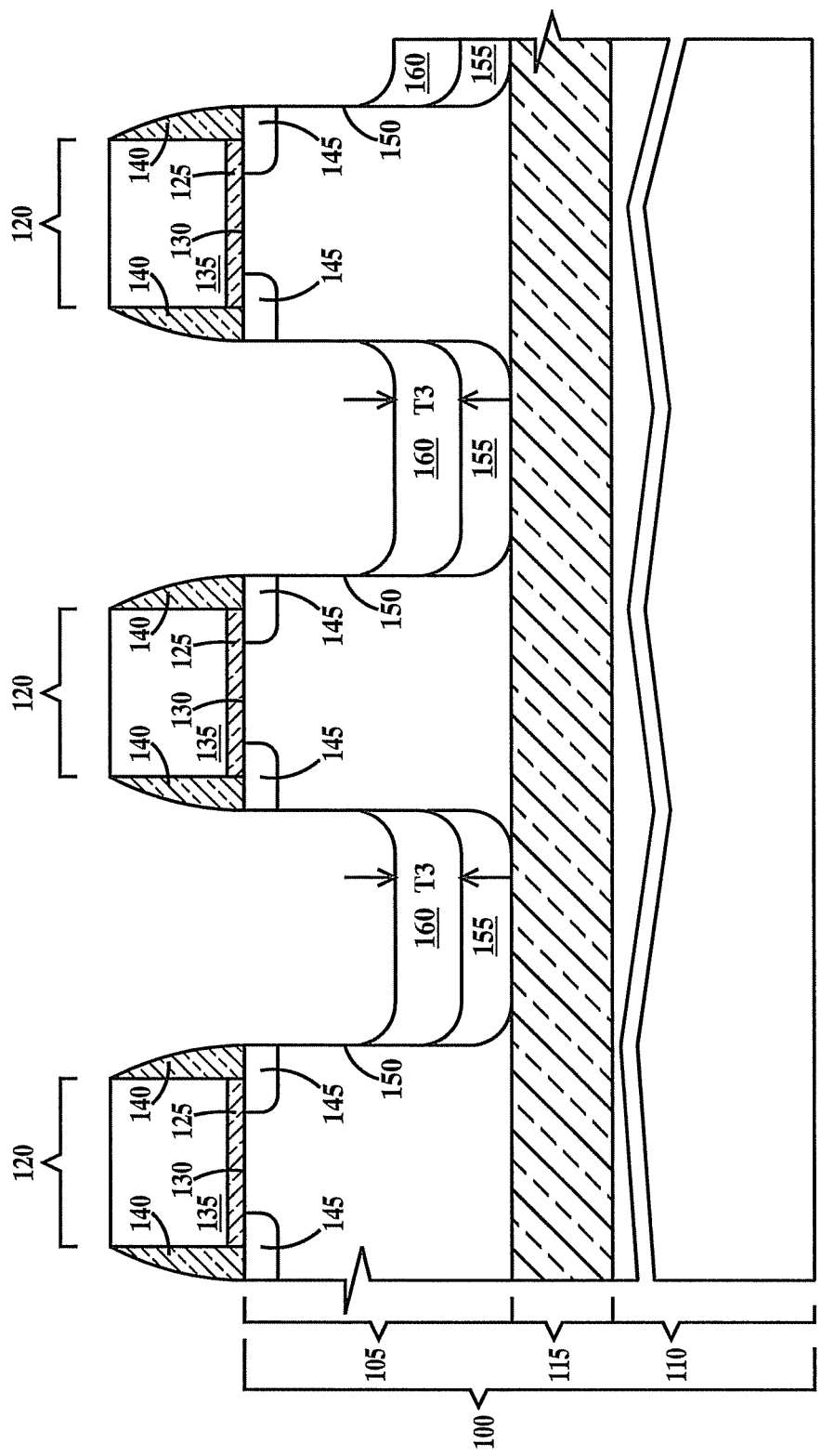

In FIG. 4, an epitaxial layer 160 is formed in trenches 150 on doped region 155. Epitaxial layer 160 may be epitaxial silicon (Si), epitaxial silicon-germanium (i.e., germanium doped silicon (SiGe)) or epitaxial silicon carbide (i.e., carbon doped silicon (SiC)). SiGe will apply compressive stress to silicon layer 105 while SiC will apply tensile stress to silicon layer 105. Epitaxial Si will be substantially stress free. For a PFET or an NFET, epitaxial layer 160 may be lightly doped P-type, lightly doped N-type, be net zero doped or intrinsic. The doping concentration of epitaxial layer 160 is less than that of doped region 155. Epitaxial layer 160 has a thickness T3. In one example, T3 is about 10 nm to about 20 nm. In one example, the dopant type of epitaxial layer 160 is the same as silicon layer 105 and the dopant concentration of epitaxial layer 160 is about the same as that of silicon layer 105. In one example, the dopant type of epitaxial layer 160 is the opposite type of silicon layer 105 and the dopant concentration of epitaxial layer 160 is about the same as that of silicon layer 105 or intrinsic (i.e., undoped as deposited). In one example, the dopant concentration of epitaxial layer 160 is about 5E17 atm/cm$^3$ to about 5E18 atm/cm$^3$.

Figure 5:
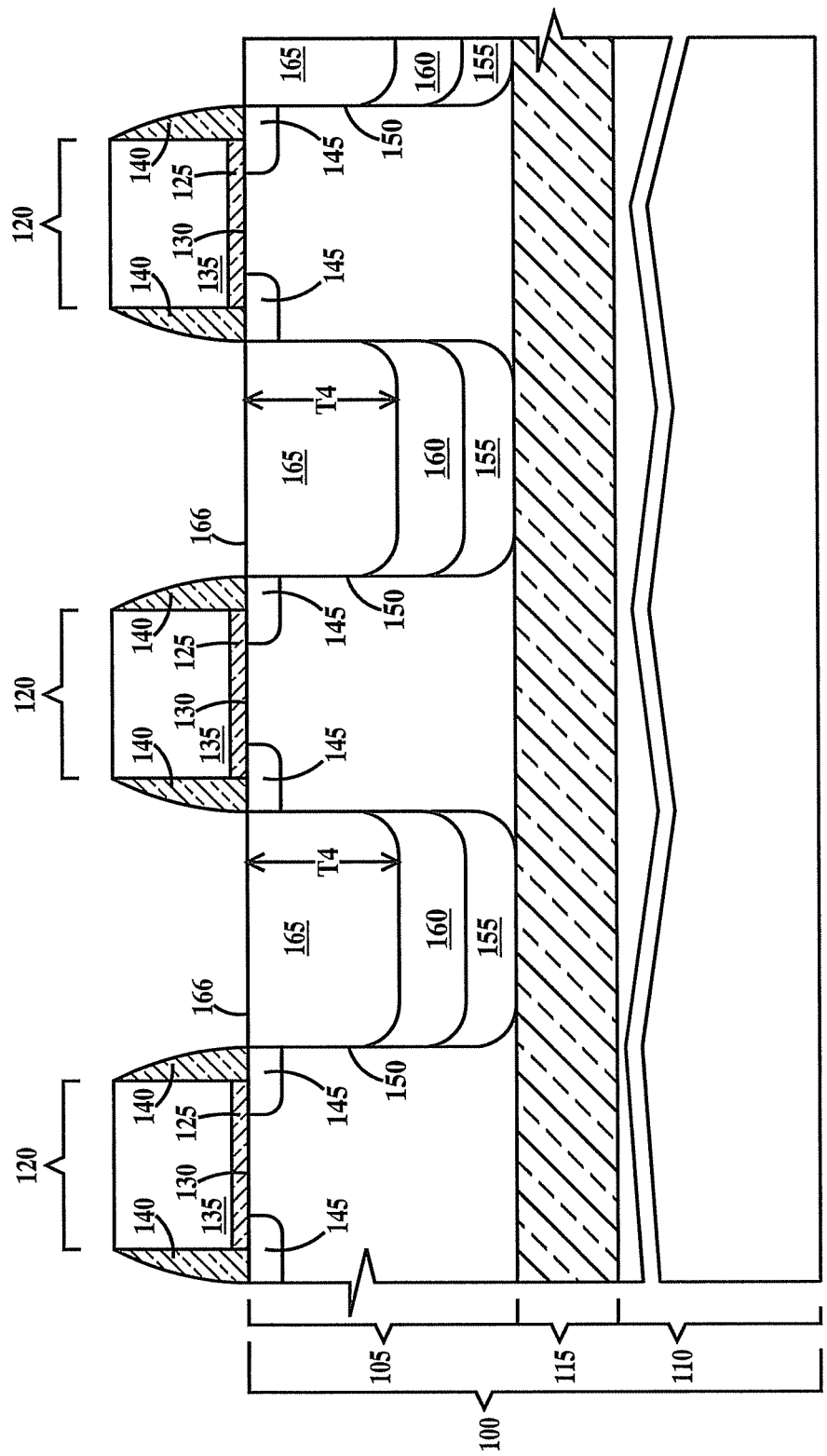
Figure 6:
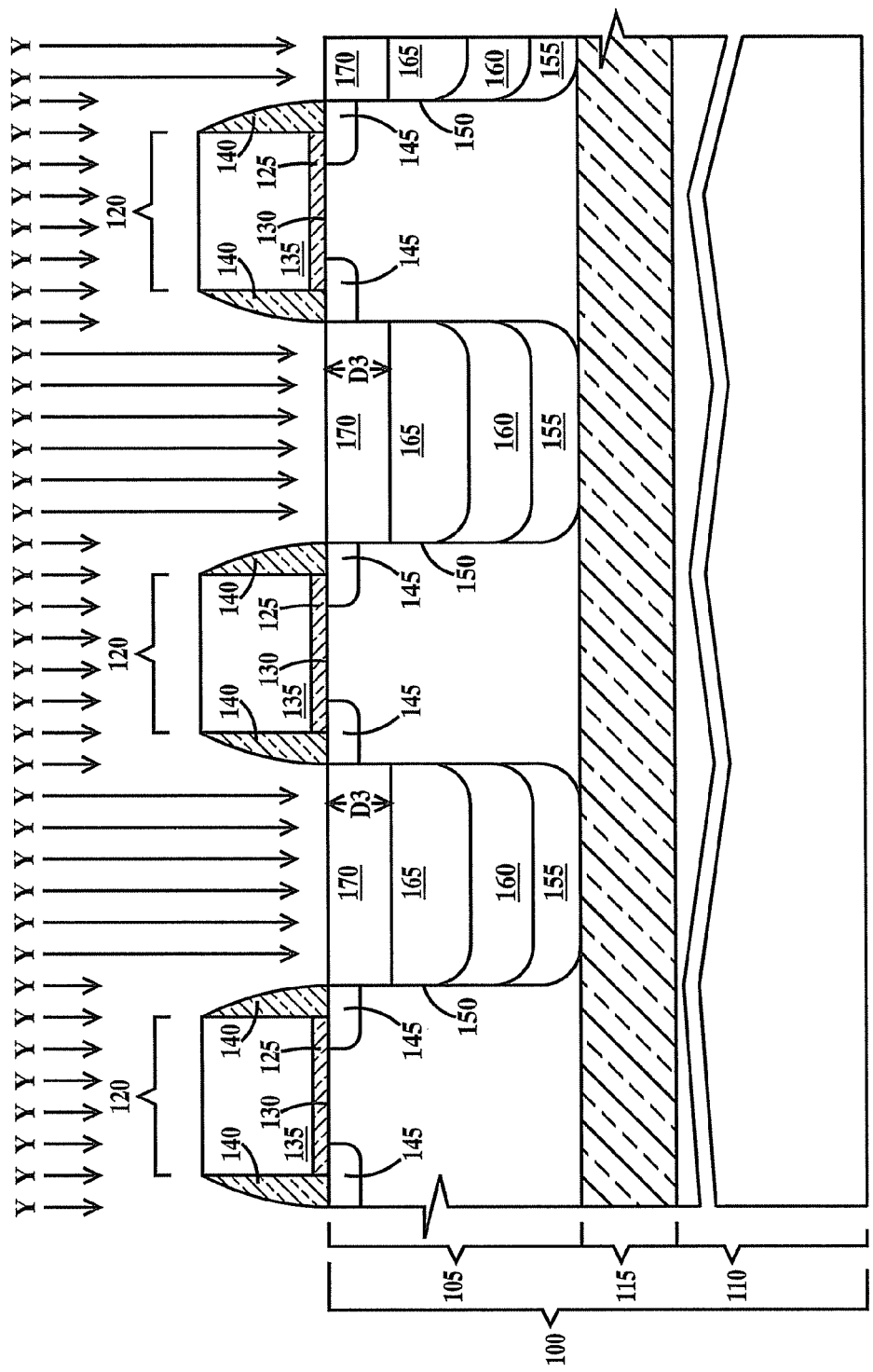

In FIG. 5, an epitaxial layer 165 is formed in trenches 150 on epitaxial layer 160. Epitaxial layer 165 may be epitaxial silicon (Si), epitaxial silicon-germanium (SiGe) or epitaxial silicon carbide (SiC). SiGe will apply compressive stress to silicon layer 105 while SiC will apply tensile stress to silicon layer 105. Epitaxial Si will be substantially stress free. For a PFET epitaxial layer 165 is doped P-type and for an NFET epitaxial layer 165 is doped N-type. The doping concentration of epitaxial layer 165 is greater than that of epitaxial layer 160 and doped region 155. Epitaxial layer 165 has a thickness T4. In one example, T4 is about 30 nm to about 50 nm. In one example, the dopant concentration of epitaxial layer 165 is about 12E20 atm/cm$^3$ to about 4E20 atm/cm$^3$. It is preferred that a top surface 166 of epitaxial layer 165 be essentially co-planer with top surface 130 of silicon layer 130. However, top surface 166 may extend above or be recessed below top surface 130. In FIG. 6, an optional ion implantation of dopant species "Y" is performed to form optional source/drains 170. For a PFET, dopant species Y is P-type, for an NFET, dopant species Y is N-type. The doping concentration of source/drains 170 is greater than that of epitaxial layer 165, epitaxial layer 160 and doped region 155. In one example, the dopant concentration of source/drains 170 is about 1E20 atm/cm$^3$ to about 2.5 E20 atm/cm$^3$. The depth D3 of the Y species ion implantation must be shallow enough that after all thermal diffusion of dopant species during the fabrication process (called the thermal budget) a lightly (e.g., less than about 1E19 atm/cm$^3$) net doped region is left between source/drains 170 and doped region 155.

Figure 7:
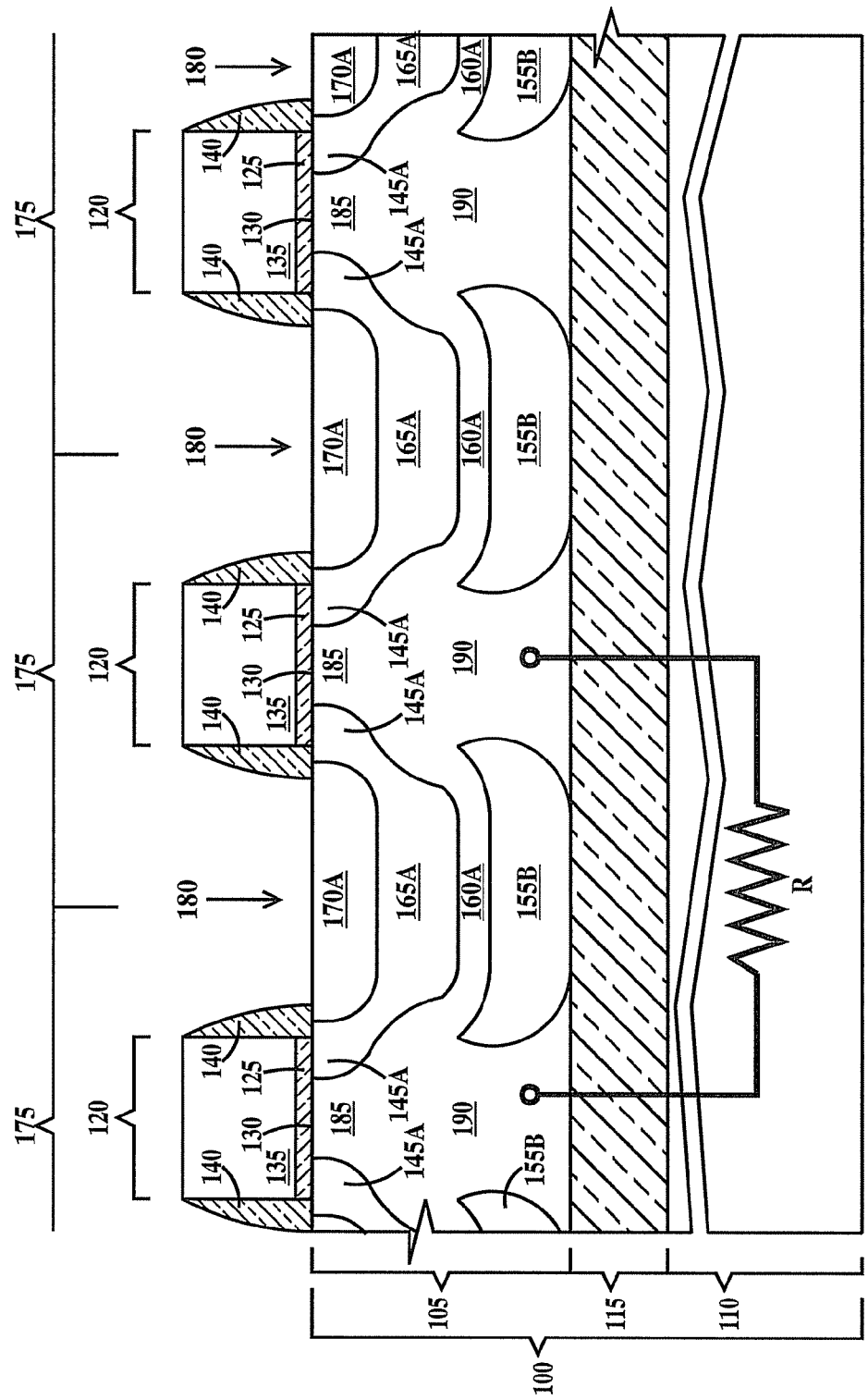
FIG. 7 is a cross-sectional representation of doping concentration profiles of adjacent PFETS after the thermal budget and fabricated according to an embodiment of the present invention.

FIG. 7 is a cross-sectional representation of doping concentration profiles of adjacent PFETS after the thermal budget and fabricated according to an embodiment of the present invention. In FIG. 7, PFETs 175 comprises first regions 170A (from source/drains 170 of FIG. 6), second regions 165A with wings 145A (from epitaxial layer 165 merging with source/drain extensions 145 of FIG. 6), third regions 160A (from epitaxial layer 160 of FIG. 6) and fourth regions 155B (from ion-implanted doped region 155 of FIG. 6). The stacks of first regions 170A, second regions 165A, third regions 160A and fourth regions 155B comprise butted SOI junction isolations 180 with the source/drains of PFETs 175 being primarily first regions 170A and the source/drain extensions being wings 145A. The channels of PFETs 175 are channel regions 185 of bodies 190.

Between forming epitaxial layer 165A (see FIG. 5) and the structure illustrated in FIG. 7, an optional anneal may be performed. In one example the optional anneal is a rapid thermal anneal (TRA) of at least about 1000° C. This anneal, if performed, is taken into account in the thermal budget of the embodiments of the present invention.

PFETs 175 reflect a fabrication process that utilized (1) a P-type source/drain extension 145 ion implantation into a lightly doped (e.g., less than about 1E19 atm/cm$^3$) N-doped silicon layer 105 (see FIG. 1), (2) a P type ion implantation into silicon layer 105 through the bottom of trench 155 (see FIG. 3A), (3) an intrinsic epitaxial silicon deposition (see 160 of FIG. 4), (4) a P doped epitaxial silicon deposition (see 165 of FIG. 6), and (5) a P type source/drain ion 170 implantation (see FIG. 6). First region 170A, second region 165A and fourth region 155B are doped P-type. Third region is intrinsic to N-type and bodies 190 and channel regions 1185 are N-type. The concentration of dopant in first region 170A is greater than the dopant concentrations of second region 165A, third region 160A and fourth region 155B. The concentration of dopant in second region 165A is greater than the dopant concentration of third region 160A and fourth region 155B. The concentration of dopant in fourth region 155B is greater than the dopant concentration of third region 160A.

In the example of FIG. 7, the dopant concentration of first region 170A is about 2E20 atm/cm$^3$. The dopant concentration of second region 165A is about 1E20 atm/cm$^3$ to about 5E19 atm/cm$^3$ decreasing in concentration with increasing depth into silicon layer 105. The dopant concentration of fourth region 155B is about 5E18 atm/cm$^3$ to about 2E19 atm/cm$^3$. The dopant concentration of third region 160A, bodies 190 and channel regions 195 is about 5E17 atm/cm$^3$ to about 5E18 atm/cm$^3$. The thickness of silicon layer 105 is about 80 nm, and the channel length is about 30 nm.

In the example of FIG. 7, because of the low dopant concentration in third region 160A (which has the lowest dopant concentration of any of the first through fourth region) short channel effects are reduced if not eliminated. This is so since the depletion layer widths of the source/drains will not be increased by the butted SOI junction isolation process of the present invention because third region 160A does not contribute any P-type dopant species to the source/drain depletion layers.

In the example where the dopant type of the first, second third and fourth regions are the same. The dopant concentration of the third region is so low it does not contribute any significant amount of P-type dopant and therefore does not increase the depletion-layer widths of the source/drains to any significant extent (e.g., an increase of the depletion-layer widths of less than about 10%).

In the example where the net dopant types of the first, second, third and fourth regions 170A, 165A and 155B are the same net dopant type and the net dopant type of the third regions 160A and bodies 185 are the same dopant type but opposite the doping type of the first, second, third and fourth regions, the resistance R measured between adjacent bodies 185 was found to be greater than about 1E9 ohm/micron in a first example and greater than about 1E11 in a second example. This indicates no current leakage between adjacent bodies. This is an unexpected result, because an inspection of FIG. 7 shows bodies 185 of adjacent PFETs 175 connected by shared third regions 160A. So one of ordinary skill in the art would expect current flow from adjacent bodies 185 through corresponding shared third regions 160A because bodies 185 and third regions 160A are doped the same type. But this is not what has been found. The opposite has been found in that there is virtually no current flow between adjacent bodies 185 through the shared third regions 160A. It is believed, based on device Technology Computer Aided Design (TCAD) analysis, for PFETs third regions 160A are so depleted of electrons they act as if they were P-type or for NFETs third regions 160A are so depleted of holes they act as if they were N-type. TCAD was pursued when actual devices fabricated according to embodiments of the present invention were found to have such unexpectedly low body-to-body current leakages.

While FIG. 7 illustrates exemplary PFETS, by changing all occurrences of P to N in the above discussion if FIG. 7, FIG. 7 would then represent an NFET.

Table I illustrates various combinations of doping concentrations and dopant types that may be utilized in butted SOI junction isolations and NFETs and PFETs using butted SOI junction isolations according to embodiments of the present invention.

TABLE I

| Region | PFET | | | NFET | | |
|---|---|---|---|---|---|---|
| First region 170A | $P^{++}$ | $P^{++}$ | $P^{++}$ | $N^{++}$ | $N^{++}$ | $N^{++}$ |
| Second region 165A | $P^{+}$ | $P^{+}$ | $P^{+}$ | $N^{+}$ | $N^{+}$ | $N^{+}$ |
| Third region 160A | $N^{-}$ | Intrinsic | $P^{-}$ | $P^{-}$ | Intrinsic | $N^{-}$ |
| Fourth region 155B | $P^{o}$ | $P^{o}$ | $P^{o}$ | $N^{o}$ | $N^{o}$ | $N^{o}$ |
| Silicon Layer 105 | $N^{-}$ or $N^{o}$ or Intrinsic | | | $P^{-}$ or $P^{o}$ or Intrinsic | | | where the symbols (++), (+), (o) and (−) denote decreasing dopant concentration from (++) to (+) to (o) to (−) and P denotes P-type dopant and N denotes N-type dopant. Note, in Table I, wherever "Intrinsic" appears "net zero doping" (i.e., equal concentrations of N and P type dopants) may be substituted.

It should be understood that while doping concentrations are "net doping concentrations" $|N_A-N_D|$ there is a limit to the total concentration $N_A+N_D$ allowable in the first, second, third, fourth regions and the silicon layer. For silicon layer 105 it is preferred that $N_A+N_D$ not be greater than about 1E19 atm/cm$^3$. For fourth region 155B it is preferred that $N_A+N_D$ not be greater than about 5E19 atm/cm$^3$. For third region 160A it is preferred that $N_A+N_D$ not be greater than about 5E19 atm/cm$^3$.

Thus, the embodiments of the present invention provide a butted SOI junction isolation structures and devices and method of fabricating butted SOI junction isolations and devices, that are scalable (reduced channel length) without attendant scaling driven short channel effects while still maintaining excellent electrical isolation between regions on opposite sides of the butted SOI junction isolation or between bodies of adjacent FETs.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
providing a silicon layer on a buried oxide layer of a silicon-on-insulator substrate;
forming a first gate electrode of a first field effect transistor on a top surface of a gate dielectric layer formed on a top surface of said silicon layer and forming a second gate of a second field effect transistor on said top surface of said gate dielectric layer;
etching a trench in said silicon layer between said first and second gate electrodes, said trench extending from a top surface of said silicon layer into said silicon layer, said trench not extending to said buried oxide layer;
ion implanting a dopant species into said silicon layer under a bottom of said trench to form a first doped region in said silicon layer, said first doped region doped to a first concentration;
performing a first epitaxial deposition to form a first epitaxial layer doped to a second concentration in said bottom of said trench, said first epitaxial layer partially filling said trench;
performing a second epitaxial deposition to form a second epitaxial layer doped to a third concentration on said first epitaxial layer in said trench; and
wherein said third concentration is greater than said first and second concentrations and said first concentration is greater than said second concentration.

2. The method of claim 1, wherein after said ion implanting said doped region, said doped region abuts said buried oxide layer.

3. The method of claim 1, including:
after said ion implanting said doped region and before forming said first epitaxial silicon layer, said doped region does not abut said buried oxide layer.

4. The method of claim 1, wherein:
(i) said doped region, said first epitaxial layer and said second epitaxial layer are all doped a same dopant type; or
(ii) said doped region and said first epitaxial layer are doped a first dopant type and said second epitaxial layer is doped a second and opposite dopant type; or
(iii) said doped region and said first epitaxial layer are doped a first dopant type and said second epitaxial layer is net doped zero or is intrinsic.

5. The method of claim 1, further including:
ion implanting a dopant species into an upper region of said second epitaxial layer to form an additional doped region doped to a fourth dopant concentration, said additional doped region extending from a top surface of said second epitaxial layer into said second epitaxial layer a distance less than the thickness of said second epitaxial layer, said fourth dopant concentration greater than said third dopant concentration.

6. The method of claim 5, wherein:
(i) said additional doped region, said first epitaxial layer and said second epitaxial layer are all doped a same dopant type; or (ii) said doped region, said additional doped region and said first epitaxial layer are doped a first dopant type and said second epitaxial layer is doped a second and opposite dopant type; or (iii) said doped region, said additional doped region and said first epitaxial layer are doped a first dopant type and said second epitaxial layer is net doped zero or is intrinsic.

7. The method of claim 5, further including:
before etching said trench in said silicon layer and after forming said gate dielectric layer and said first and second gate electrodes, ion implanting first source/drain extensions on opposite sides of said first gate electrode into said silicon layer and ion implanting second source/drain extensions on opposite sides of second gate electrode, said first source/drain extensions extending under said first gate electrode and separated by a first channel region of said silicon layer under said gate electrode, said second source/drain extensions extending under said second gate electrode and separated by a second channel region of said silicon layer, said first and said second source/drain extensions doped said first dopant type.

8. The method of claim 5, further including:
after performing said second epitaxial layer, ion-implanting a first source/drain of said first field effect transistor and a shared source/drain of said first and second field effect transistors and a second source/drain of said second field effect transistor into an upper region of said second epitaxial layer, said first, common and second source/drains doped to a fourth dopant concentration, said first, common and second source/drains doped said first dopant type, said first, common and second source/drains extending from a top surface of said second epitaxial layer into said second epitaxial layer a distance less than the thickness of said second epitaxial layer, said fourth dopant concentration greater than said third dopant concentration.

9. The method of claim 8, wherein said second epitaxial layer does not contribute any P-type dopant species to depletion layers of said first, said common and said second source/drains.

10. The method of claim 1, wherein after forming said second epitaxial layer and performing an anneal of greater than room temperature an electrically resistive channel is formed in a region of said first epitaxial layer, said electrically resistive channel physically connecting a first region of said silicon layer under said first gate electrode to a second region of said silicon laser under said second gate electrode.

11. The method of claim 5, wherein after forming said second epitaxial layer and performing an anneal of greater than room temperature an electrically resistive channel is formed in a region of said first epitaxial layer, said electrically resistive channel physically connecting a first region of said silicon layer under said first gate electrode to a second region of said silicon laser under said second gate electrode.

12. The method of claim 1, wherein said first epitaxial layer includes silicon and includes germanium.

13. The method of claim 1, wherein said first epitaxial layer includes silicon and includes carbon.

14. The method of claim 1, wherein-said second epitaxial layer includes silicon and excludes other group IV atoms.

15. The method of claim 1, wherein said second epitaxial layer includes silicon and includes germanium.

16. The method of claim 1, wherein said second epitaxial layer includes silicon and includes carbon.

17. The method of claim 5, wherein after forming said second epitaxial layer and performing an anneal of greater than room temperature an electrically resistive channel is formed in a region of said first epitaxial layer, said electrically resistive channel physically connecting a first region of said silicon layer under said first gate electrode to a second region of said silicon laser under said second gate electrode, and after said anneal when said first epitaxial layer is doped N-type while said electrically resistive channel is doped N-type it is depleted of electrons and behaves electrically as a P-type doped region and when said first epitaxial layer is doped P-type while said electrically resistive channel is doped P-type it is depleted of holes and behaves electrically as an N-type doped region.

18. The method of claim 1, wherein said first epitaxial layer includes silicon and excludes other group IV atoms.

19. The method of claim 1 further including:
before etching said trench in said silicon layer and after forming said gate dielectric layer and said first and second gate electrodes, ion implanting first source/drain extensions on opposite sides of said first gate electrode into said silicon layer and ion implanting second source/drain extensions on opposite sides of second gate electrode, said first source/drain extensions extending under said first gate electrode and separated by a first channel region of said silicon layer under said gate electrode, said second source/drain extensions extending under said second gate electrode and separated by a second channel region of said silicon layer, said first and said second source/drain extensions doped said first dopant type.

20. The method of claim 1, further including:
after performing said second epitaxial layer, ion-implanting a first source/drain of said first field effect transistor and a shared source/drain of said first and second field effect transistors and a second source/drain of said second field effect transistor into an upper region of said second epitaxial layer, said first, said common and said second source/drains doped to a fourth dopant concentration, said first, said common and said second source/drains doped said first dopant type, said first, said common and said second source/drains extending from a top surface of said second epitaxial layer into said second epitaxial layer a distance less than the thickness of said second epitaxial layer, said fourth dopant concentration greater than said third dopant concentration.

21. The method of claim 20, wherein said second epitaxial layer does not contribute any P-type dopant species to depletion layers of said first, said common and said second source/drains.

22. The method of claim 1, wherein after forming said second epitaxial layer and performing an anneal of greater than room temperature an electrically resistive channel is formed in a region of said first epitaxial layer, said electrically resistive channel physically connecting a first region of said silicon layer under said first gate electrode to a second region of said silicon laser under said second gate electrode, and after said anneal when said first epitaxial layer is doped N-type while said electrically resistive channel is doped N-type it is depleted of electrons and behaves electrically as a P-type doped region and when said first epitaxial layer is doped P-type while said electrically resistive channel is doped P-type it is depleted of holes and behaves electrically as an N-type doped region.

* * * * *